United States Patent
Geurts et al.

(10) Patent No.: US 9,214,908 B2
(45) Date of Patent: Dec. 15, 2015

(54) AMPLIFICATION CIRCUIT

(71) Applicant: NXP B.V., Eindhoven (NL)

(72) Inventors: Marcel Geurts, Nijmegen (NL); Louis Praamsma, Arnhem (NL); Michel Groenewegen, Malden (NL); Rainier Breunisse, Arnhem (NL); Freek van Straten, Mook (NL); Robert Buytenhuijs, Wijchen (NL)

(73) Assignee: NXP, B.V., Eindhoven (NL)

( * ) Notice: Subject to any disclaimer, the term of this patent is extended or adjusted under 35 U.S.C. 154(b) by 0 days.

(21) Appl. No.: 14/445,187

(22) Filed: Jul. 29, 2014

(65) Prior Publication Data

US 2015/0078420 A1    Mar. 19, 2015

(30) Foreign Application Priority Data

Aug. 1, 2013    (EP) .................................... 13178990

(51) Int. Cl.
| | | |
|---|---|---|
| H04L 27/00 | (2006.01) | |
| H03F 3/45 | (2006.01) | |
| H03F 1/32 | (2006.01) | |
| H03F 1/56 | (2006.01) | |
| H03F 3/19 | (2006.01) | |
| H03H 7/075 | (2006.01) | |
| H03F 1/02 | (2006.01) | |
| H03H 7/38 | (2006.01) | |
| H03H 9/02 | (2006.01) | |
| H04B 1/7097 | (2011.01) | |

(52) U.S. Cl.
CPC .............. *H03F 3/45071* (2013.01); *H03F 1/02* (2013.01); *H03F 1/3211* (2013.01); *H03F 1/56* (2013.01); *H03F 3/19* (2013.01); *H03H 7/075* (2013.01); *H03H 7/38* (2013.01); *H03H 9/02535* (2013.01); *H04B 1/7097* (2013.01); *H03F 2200/165* (2013.01); *H03F 2200/171* (2013.01); *H03F 2200/294* (2013.01); *H03F 2203/45148* (2013.01); *H03F 2203/45544* (2013.01); *H03F 2203/45554* (2013.01)

(58) Field of Classification Search
CPC .... H04B 1/1036; H04B 1/109; H04B 1/0458; H03F 2200/294; H03F 2200/451; H03D 7/1458; H03G 3/3052; H03H 9/0028; H03H 9/6483; H03H 7/12
USPC .................................................. 375/148, 316
See application file for complete search history.

(56) References Cited

U.S. PATENT DOCUMENTS

| | | | |
|---|---|---|---|
| 3,872,410 A | 3/1975 | Zucker | |
| 5,499,003 A | 3/1996 | Davenport | |

(Continued)

FOREIGN PATENT DOCUMENTS

| | | |
|---|---|---|
| EP | 1 246 358 A2 | 2/2002 |
| WO | 96/20530 A1 | 7/1996 |

OTHER PUBLICATIONS

Extended European Search Report for application No. 13178990.1 (Jun. 16, 2014).

*Primary Examiner* — Don N Vo

(57) ABSTRACT

An amplification circuit (100) comprising a first filter (102) and an LNA (110). The first filter (102) comprising an input (104) for receiving an input signal; a first differential output (106); and a second differential output (108). The first filter (102) has a differential mode of operation for frequencies in its pass-band (706, 806) and a common mode of operation for frequencies outside its pass-band (706, 806), and may be an acoustic wave filter. The LNA (110) comprising a first differential input (112) connected to the first differential output (106) of the first filter (102); a second differential input (114) connected to the second differential output (108) of the first filter (102); and an output (116) for providing an amplified output signal.

16 Claims, 4 Drawing Sheets

(56) References Cited

U.S. PATENT DOCUMENTS

Figure 1:
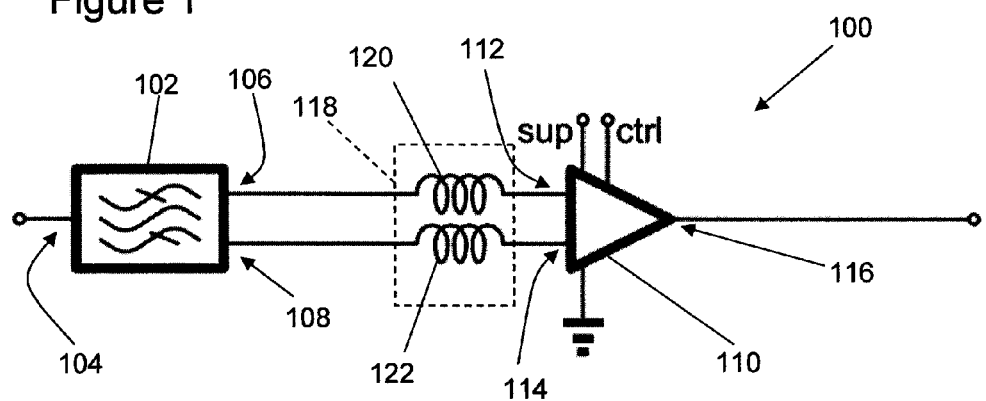

| | | |
|---|---|---|
| 5,692,279 A | 12/1997 | Mang et al. |
| 5,930,696 A * | 7/1999 | Tzuang et al. ............... 455/311 |
| 7,795,960 B2 * | 9/2010 | Lyden et al. .................. 330/9 |
| 2003/0017809 A1 * | 1/2003 | Garlepp et al. ............... 455/87 |
| 2006/0181369 A1 | 8/2006 | Shibahara |
| 2011/0267144 A1 | 11/2011 | Behera et al. |
| 2012/0329418 A1 * | 12/2012 | Chang et al. .................. 455/296 |

* cited by examiner

AMPLIFICATION CIRCUIT

CROSS-REFERENCE TO RELATED APPLICATIONS

This application claims the priority under 35 U.S.C. §119 of European patent application no. 13178990.1, filed on Aug. 1, 2013, the contents of which are incorporated by reference herein.

The present disclosure relates to amplification circuits, and in particular, although not necessarily, to amplification circuits for GPS receivers.

According to a first aspect of the present invention there is provided an amplification circuit comprising:
a first filter comprising:
an input for receiving an input signal;
a first differential output; and
a second differential output;
wherein the first filter has a differential mode of operation for frequencies in its pass-band and a common mode of operation for frequencies outside its pass-band; and
an LNA comprising:
a first differential input connected to the first differential output of the first filter;
a second differential input connected to the second differential output of the first filter; and
an output for providing an amplified output signal.

Such an amplification circuit can provide good non-linearity performance (for example in terms of IM2 and IM3 suppression), whilst requiring fewer surface mounted devices/components than other amplification circuits.

The first filter may be a first acoustic wave filter such as a surface acoustic wave (SAW) filter or a bulk acoustic wave filter (BAW).

The first filter may define one or more of:
a first magnitude transfer function from the input of the first filter to the first differential output of the first filter;
a second magnitude transfer function from the input of the first filter to the second differential output of the first filter;
a first phase transfer function from the input of the first filter to the first differential output of the first filter; and
a second phase transfer function from the input of the first filter to the second differential output of the first filter.

The difference between the first magnitude transfer function and the second magnitude transfer function for frequencies outside the pass-band of the first filter may be less than a first threshold value. The difference between the first phase transfer function and the second phase transfer function for frequencies outside the pass-band of the first filter may be less than a second threshold value. The difference between the first phase transfer function and the second phase transfer function for frequencies inside the pass-band of the first filter may be less than a third threshold value away from 180°.

The amplification circuit may further comprise a matching circuit connected in series between the first and second differential inputs of the LNA and the first and second differential outputs of the first filter.

The matching circuit may comprise a low-pass matching circuit. The low-pass matching circuit may comprise a first inductor in series between the first differential input of the LNA and the first differential output of the first filter, and a second inductor in series between the second differential input of the LNA and the second differential output of the first filter.

The matching circuit may comprise a high-pass matching circuit. The high-pass matching circuit may comprise a first capacitor in series between the first differential input of the LNA and the first differential output of the first filter, a second capacitor in series between the second differential input of the LNA and the second differential output of the first filter, and either (i) an inductor connected between the first differential input of the LNA and the second differential input of the LNA; or (ii) a notch filter connected between the first differential input of the LNA and the second differential input of the LNA.

The first capacitor and/or second capacitor may comprise integrated capacitors. One or more of the first capacitor, second capacitor and first filter may be provided in a single integrated circuit.

The input to the first filter may comprise a single-ended input.

The output of the LNA may comprise a single-ended output.

The amplification circuit may further comprise a second filter comprising a single-ended input connected to the single-ended output of the LNA, and an output for providing a filtered amplified output signal.

The output of the LNA may comprise a first differential output and a second differential output.

The amplification circuit may further comprise a second filter comprising a first differential input connected to the first differential output of the LNA, a second differential input connected to the second differential output of the LNA, and an output for providing a filtered amplified output signal. The second filter may have a differential mode of operation for frequencies in its pass-band and a common mode of operation for frequencies outside its pass-band. The second filter may be an acoustic wave filter.

There may be provided a receiver circuit, for example a GPS receiver circuit, comprising:
an antenna;
a first acoustic wave filter comprising:
an input connected to the antenna for receiving an input signal;
a first differential output; and
a second differential output;
wherein the first filter has a differential mode of operation for frequencies in its pass-band and a common mode of operation for frequencies outside its pass-band;
an LNA comprising:
a first differential input connected to the first differential output of the first filter;
a second differential input connected to the second differential output of the first filter; and
an output for providing an amplified output signal; and
a receiver component, for example a GPS receiver component, comprising an input that is connected to the output of the LNA.

Figure 2:
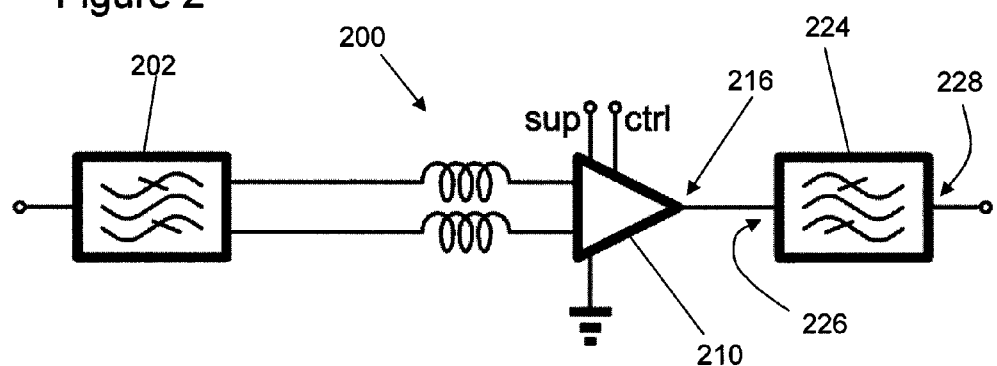
Figure 3:
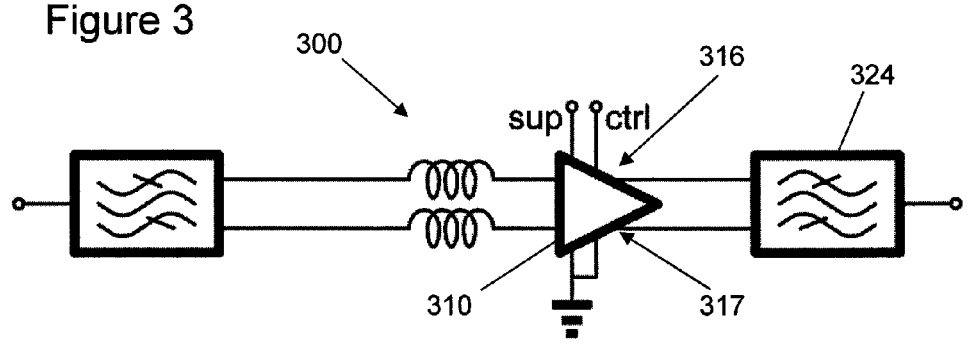
Figure 4:
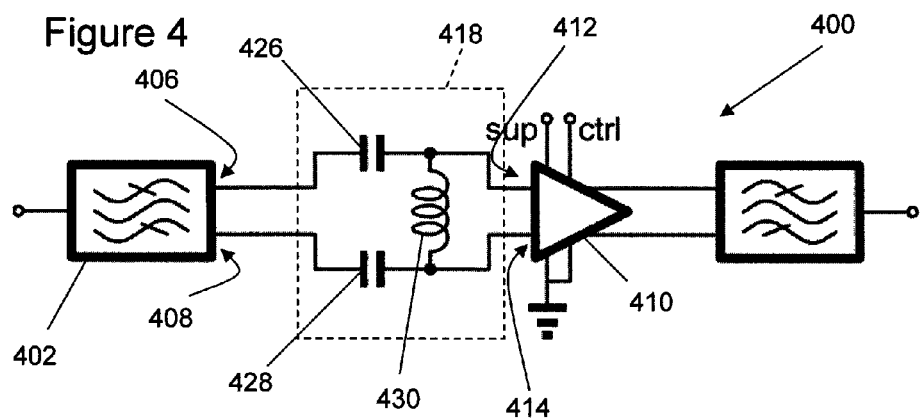
Figure 5:
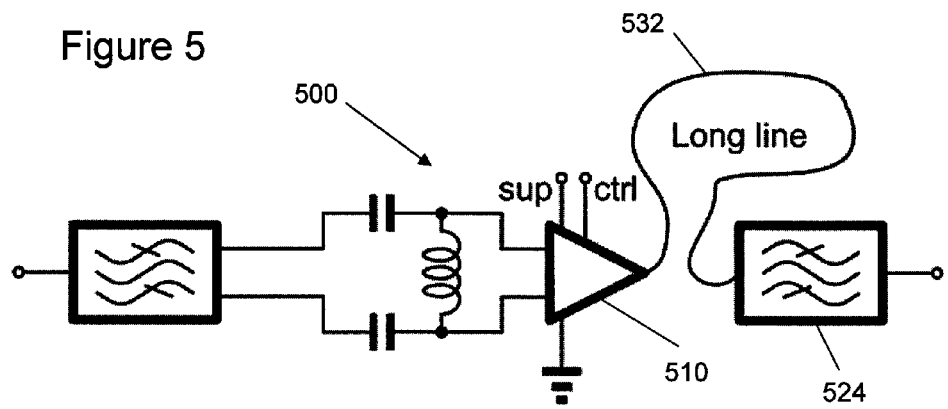
Figure 6:
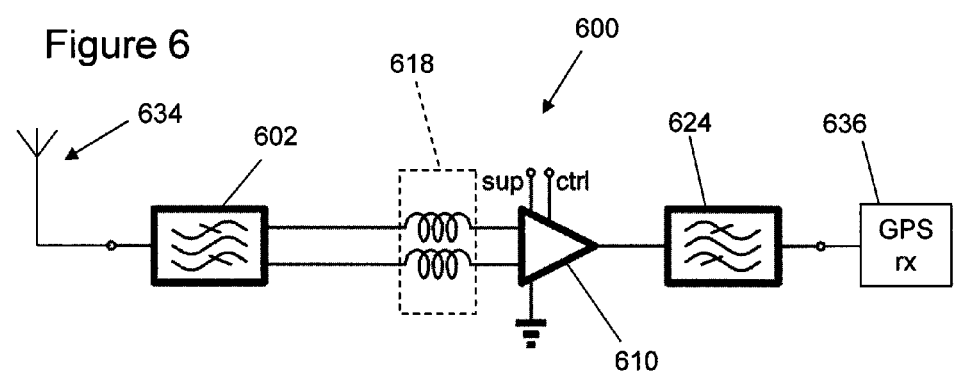
Figure 7:
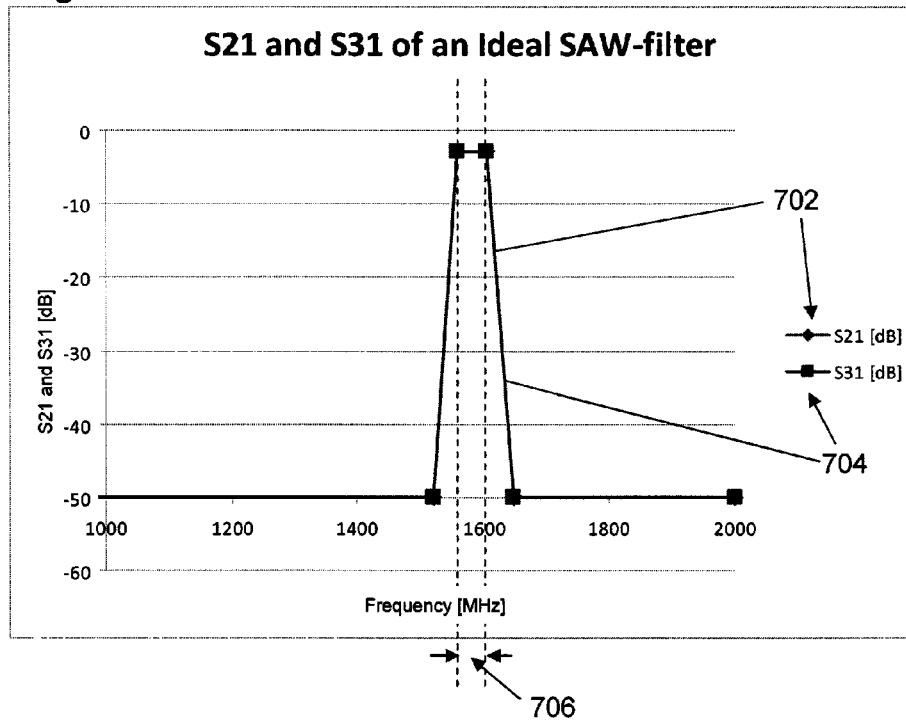
Figure 8:
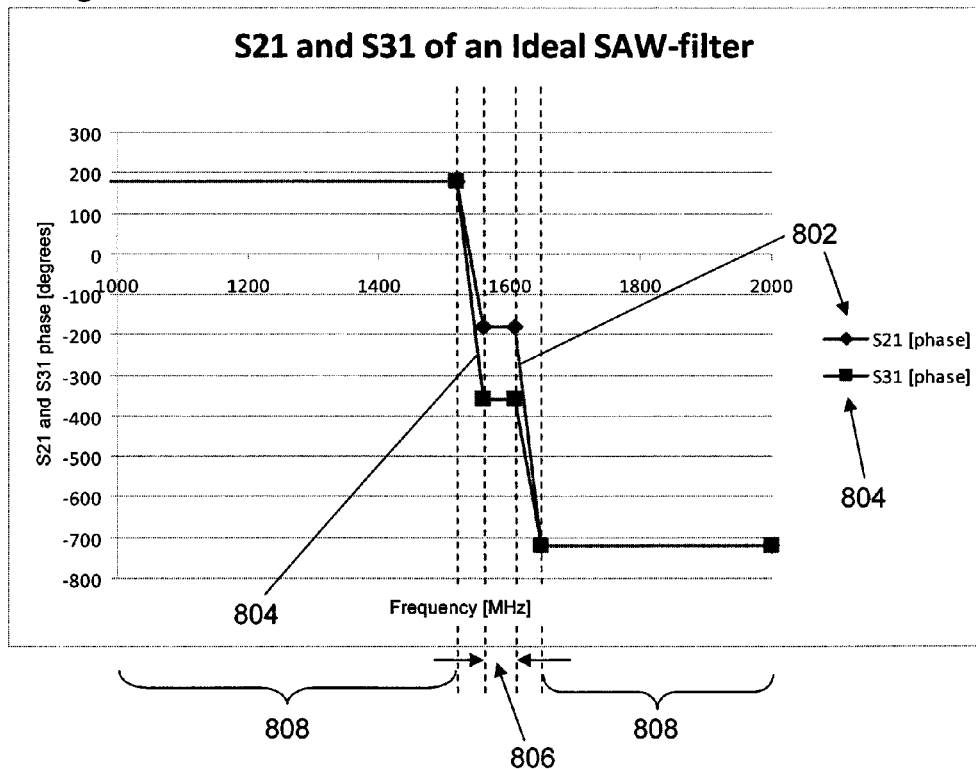
Figure 9:
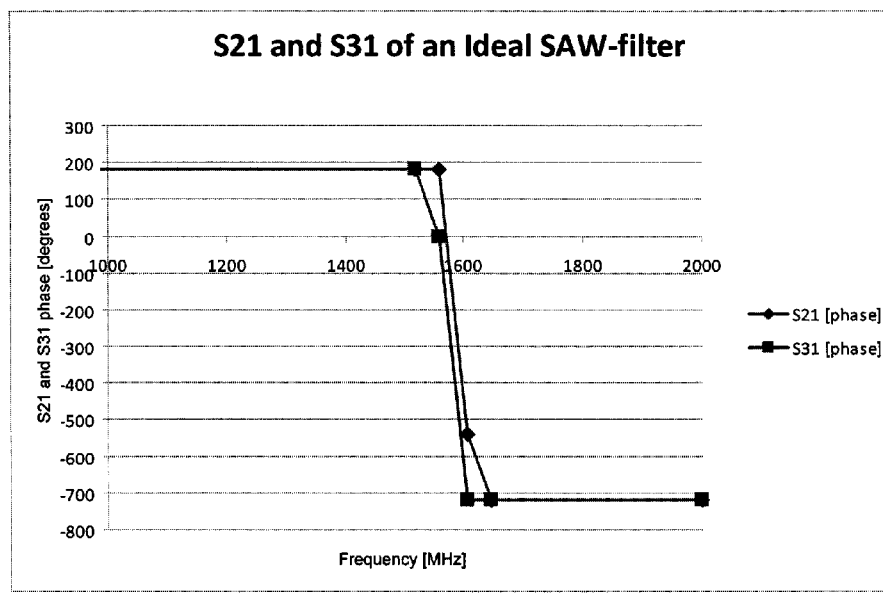
Figure 10:
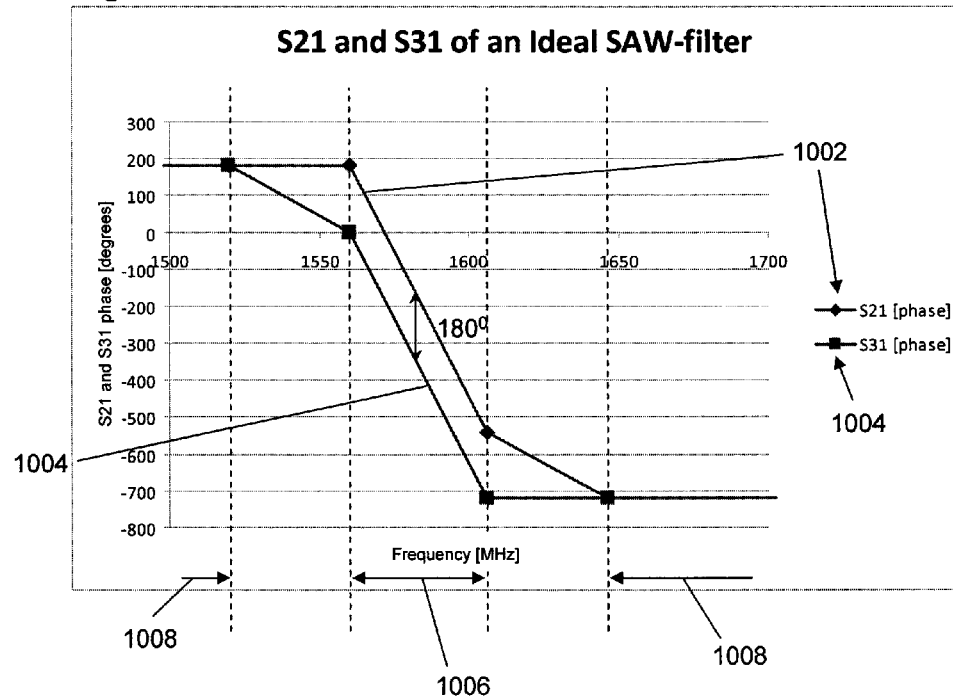

Embodiments of the present invention will now be described by way of example and with reference to the accompanying drawings in which:
FIG. 1 illustrates an amplification circuit;
FIG. 2 illustrates another amplification circuit;
FIG. 3 illustrates a further amplification circuit;
FIG. 4 illustrates a further still amplification circuit;
FIG. 5 illustrates an yet further amplification circuit;
FIG. 6 illustrates a GPS receiver circuit;
FIG. 7 illustrates schematically the magnitude transfer function of an ideal SAW filter; and
FIGS. 8 to 10 illustrate schematically example phase transfer functions of an ideal SAW filter.

One or more examples disclosed herein relate to an amplification circuit that includes a first filter and a low noise amplifier (LNA). In particular, the first filter may be an acoustic wave filter such as a surface acoustic wave (SAW) filter or a bulk acoustic wave filter (BAW) with balanced/differential signalling outputs that are connected to balanced/differential signalling inputs of the LNA. It has been found this combination of components provides very good non-linearity performance (for example in terms of IM2 and IM3 suppression), yet requires fewer surface mounted devices/components than other amplification circuits. The improved performance, especially in terms of IM3, can be provided by the acoustic wave filter having a well-balanced differential mode of operation for frequencies in the pass-band and a common-mode of operation for frequencies outside the pass-band. Such an amplification circuit can be particularly advantageous for GPS receivers.

FIG. 1 illustrates an amplification circuit 100 that includes a first filter 102 and an LNA 110. In this example the first filter 102 is a surface acoustic wave (SAW) filter, although other types of acoustic wave filters such as a bulk acoustic wave (BAW) filter could be used.

The first SAW filter 102 has an input 104 for receiving an input signal, in this example a single-ended signal. In some examples the input signal may be received either directly or indirectly from an antenna (not shown). The first SAW filter 102 has a first differential output 106 and a second differential output 118 that are configured to provide differential output signalling in accordance with the single-ended input signal received at the input 104. The differential outputs 106, 108 may also be referred to as balanced outputs.

The SAW filter 102 in this example is a band-pass filter. An ideal differential SAW filter 102 has a differential-mode of operation in the pass-band, while having a common-mode of operation in the lower and higher stop-bands. These properties have been found to provide a good intermodulation performance of the amplification circuit 100. Therefore, a well-balanced SAW filter 102 can be particularly advantageous. Further details of the first SAW filter are provided below with reference to FIGS. 7 to 10.

The LNA 110 has a first differential input 112 that is connected to the first differential output 106 of the SAW filter 102, and a second differential input 114 that is connected to the second differential output 108 of the SAW filter 102. The LNA 110 also has an output 116 for providing an amplified output signal. In this example the output 116 provides a single-ended amplified output signal.

Also shown in FIG. 1 is an optional low-pass matching circuit 118, which is connected in series between the two differential inputs 112, 114 of the LNA 110 and the two differential outputs 106, 108 of the SAW filter 102. The low-pass matching circuit 118 includes a first inductor 120 in series between the first differential input 112 of the LNA 110 and the first differential output 106 of the SAW filter 102. The low-pass matching circuit 118 also includes a second inductor 122 in series between the second differential input 114 of the LNA 110 and the second differential output 108 of the SAW filter 102.

The low-pass matching circuit 118 is used to impedance match the outputs 106, 108 of the SAW filter 102 with the inputs 112, 114 of the LNA 110 in order to further improve performance of the amplification circuit 100. The low-pass matching circuit 118 can be used to match with respect to a characteristic impedance environment of 50 ohms, for example. It will be appreciated from the description that follows that other types of matching circuit can also be used.

FIGS. 2 to 5 illustrate amplification circuits that are similar to the circuit of FIG. 1. Components that have already been described with reference to an earlier figure will not necessarily be described again for subsequent figures.

In FIG. 2, a second filter 224 is provided. In this example the second filter 224 is a second SAW filter has a differential mode of operation for frequencies in its pass-band and a common mode of operation for frequencies outside its pass-band. The input 226 of the second filter 224 is connected to the output 216 of the LNA. In this example, the second filter 224 has a single input 226 as it receives a single-ended signal from the output 216 of the LNA 210. The output 228 of the second filter 224 is a filtered amplified output signal. The second filter 224 in this example is also a band-pass filter.

The requirements of the second filter 224 can be relatively low as its input signal from the LNA 210 can already have relatively low signal components at frequencies outside the pass-band. This can be because the combination of the first SAW filter 202 and the LNA 210 have effectively filtered out the signals outside the pass-band and then only amplified the signals at frequencies within the pass-band. This can result in a smaller and less expensive second filter 224.

FIG. 3 illustrates an amplification circuit 300 including an LNA 310 that has two differential signalling outputs: a first differential output 316 and a second differential output 317. In this example, the two differential outputs 316, 317 are respectively connected to two differential inputs of a second filter 324.

FIG. 4 illustrates an amplification circuit 400 that includes a high-pass matching circuit 418 for impedance matching between the outputs 406, 408 of the SAW filter 402 and the inputs 412, 414 of the LNA 410. In contrast, the matching circuits that are shown in FIGS. 1 to 3 are low-pass matching circuits.

The high-pass matching circuit 418 includes:
  a first capacitor 426 in series between the first differential input 412 of the LNA 410 and the first differential output 406 of the SAW filter 402;
  a second capacitor 428 in series between the second differential input 414 of the LNA 410 and the second differential output 408 of the SAW filter 402; and
  an inductor 430 connected between the first differential input 412 of the LNA 410 and the second differential input 414 of the LNA 410.

The first and second capacitors 426, 428 each have a first plate that is connected to a respective one of the outputs 406, 408 of the SAW filter 402, and a second plate that is connected to both (i) a respective one of the inputs 412, 414 of the LNA 410 and (ii) an end of the inductor 430.

Advantageously, the first capacitor 426, the second capacitor 428 and the first SAW filter 402 can be provided in a single integrated circuit. This enables the number of components and/or surface mounted devices to be reduced further, whilst still achieving a good level or performance.

In some examples, the inductor 430 of FIG. 4 can be replaced by a notch filter, which may also be referred to as a band-stop filter. In this way, impedance matching can be performed by a combination of high-pass matching and a notch filter.

FIG. 5 illustrates an amplification circuit 500 that includes a "long line" 532 between the LNA 510 and the second filter 524. This "long line" 532 may be a relatively long track on a printed circuit board (PCB). It can be advantageous for this "long line" 532 to be a single-ended connection as the associated track will occupy less space than equivalent differential signalling tracks. Therefore, in some examples an LNA 510 that provides a single-ended output signal can be considered beneficial.

In some applications, such as satellite positioning systems including GPS, the Russian GLONASS and European Galileo system, the intermodulation and linearity requirements are very stringent. Satellite positioning systems often require detection of very weak signals from a satellite in the presence of relatively high-power interference signals associated with mobile standards, like UMTS, GSM, LTE, WLAN, etc, that are presently offered in all kind of mobile devices, for example. It has been found that using a combination of a balanced/differential SAW filter and a balanced/differential LNA as described herein can improve the intermodulation and linearity performance when compared with known circuits such that stringent intermodulation requirements can be satisfied. Also, the number of components and/or surface mounted devices (SMDs) can be reduced, which can lead to a lower cost of the bill-of-material (BOM). These advantages can be particularly evident over use of a single-ended SAW filter and a single-ended LNA.

FIG. 6 illustrates a GPS receiver circuit 600 that includes the amplification circuit of FIG. 2. It will be appreciated that any amplifier circuit disclosed herein could also be used in a similar GPS receiver circuit.

The GPS receiver circuit 600 includes an antenna 634 for receiving input signals from a plurality of satellites, as is known in the art. The antenna 634 is connected to the single-ended input of a first SAW filter 602. The first SAW filter 602 has two differential outputs that are connected to respective differential inputs of an LNA 610, via an optional low-pass matching circuit 618 in this example. The LNA 610 has a single-ended output that is connected to a single-ended input of a second filter 624. The second filter 624 has a single-ended output that is connected to a GPS receiver component, which is known in the art.

The GPS receiver circuit 600 of FIG. 6 can enable a shorter Time-To-First-Fix to be achieved despite the presence of high power interference signals. Also, better and faster satellite positioning information can be determined.

In some examples, the first SAW filter 602 can be connected to the antenna 634 independently of any intervening pre-filtering components, which may otherwise be required for circuits that use a single-ended SAW filter and a single-ended LNA. The first SAW filter 602 may be connected directly to the antenna 634.

In other examples, notch filters (not shown) can be provided between the antenna 634 and the first SAW filter 602 in order to block some high power interference and provide electrostatic discharge (ESD) protection.

FIG. 7 illustrates an example magnitude transfer function of an ideal SAW filter. FIGS. 8 to 10 illustrate example phase transfer functions of an ideal SAW filter. The ideal SAW filter may be the first or second filter described above. An ideal SAW filter has good magnitude and phase balance between both differential outputs, both in the pass-band and in the stop-band. The term "S21" is used to represent forward transmission from a single-ended input of the SAW filter to a first differential output of the SAW filter. The term "S31" is used to represent forward transmission from a single-ended input of the SAW filter to a second differential output of the SAW filter.

FIG. 7 shows frequency on the horizontal axis and magnitude on the vertical axis. The pass-band is shown in FIG. 7 with reference 706.

Two plots are shown in FIG. 7: a first plot 702 that represents a first magnitude transfer function from the input of the SAW filter to the first differential output of the SAW filter (referred to in the figure as S21[dB]); and a second plot 704 that represents a second magnitude transfer function from the input of the SAW filter to the second differential output of the SAW filter (S31[dB]). The first plot 702 and the second plot 704 are substantially coincident for all frequencies shown. It has been found that the first plot 702 and the second plot 704 remain coincident in some examples for frequencies of up to, and possibly beyond, 6 GHz.

It can be seen from FIG. 7 that for frequencies in the pass-band 706 both the first plot 702 and the second plot 704 have a magnitude of about −3 dB, which represents a low insertion loss. For frequencies outside the pass-band 706, the magnitude values of the first and second plots 702, 704 are similar or identical, which may be considered as the difference between the values being less than a first threshold, such as 3 dB, 2 dB or 1 dB for an insertion loss of about −40 dB. It has been found that the absolute value of the magnitude at frequencies outside the pass-band 706 is less important to IM2 and IM3 performance than the balance between the magnitude of the signals at the first and second differential outputs. This is because any imbalance will be amplified by the subsequent differential LNA as a differential signal.

FIG. 8 shows frequency on the horizontal axis and phase on the vertical axis. Two plots are shown in FIG. 8: a first plot 802 that represents a first phase transfer function from the input of the SAW filter to the first differential output of the SAW filter (S21[phase]); and a second plot 804 that represents a second phase transfer function from the input of the SAW filter to the second differential output of the SAW filter (S31[phase]). The first plot 802 and the second plot 804 are not substantially coincident for all frequencies shown. The pass-band is shown in FIG. 8 with reference 806. The stop-bands are shown with reference 808. Guard bands are located between the pass-band 806 and the stop-bands 808.

It can be seen from FIG. 8 that for frequencies in the stop-bands 808, which are outside the pass-band 806, the phase values of the first and second plots are similar or identical, which may be considered as the difference between the values being less than a second threshold, such as 40°, 30° or 20°. As above, it has been found that the absolute value of the phase at frequencies outside the pass-band 806 is less important than the balance between the phase of the signals and that the first plot 802 and the second plot 804 remain substantially coincident for frequencies of up to, and possibly beyond, 6 GHz.

For frequencies inside the pass-band 806, the phase of the first plot 802 differs from the phase of the second plot 804 by substantially 180°. That is, the phase difference between the first plot 802 and the second plot 804 for frequencies inside the pass-band 806 may be less than a third threshold value away from 180°. The third threshold value may be about 20°, 10° or 5°, for example. That is, the phase difference between the first plot 802 and the second plot 804 in the pass-band 806 may be in the range of 160° to 200°, 170° to 190°, or 175° to 185°, for example. This represents a well-balanced differential signal.

In this example the absolute phase values of the first plot 802 and the second plot 804 are substantially constant in the pass-band 806.

FIGS. 9 and 10 illustrate an alternative pair of phase transfer functions. Both FIGS. 9 and 10 show frequency on the horizontal axis and phase on the vertical axis. However, the frequency on the horizontal axis in FIG. 10 is 1500 MHz to 1700 MHz, whereas the frequency on the horizontal axis in FIG. 9 is 1000 MHz to 2000 MHz. The absolute phase values of the first plot 1002 and the second plot 1004 are not substantially constant in the pass-band 1006. However, it can be seen from FIG. 10 in particular that the phase difference between the first plot 1002 and the second plot 1004 is substantially constant for frequencies in the pass-band 1006, with a value of about 180°. As above, the phase values of the first and second plots 1002, 1004 are similar or identical in the stop-bands 1008.

It will be appreciated from the above description of FIGS. 7 to 10 that a SAW filter (or any other type of filter) described herein has a well-balanced differential-mode of operation in the pass-band, while having a common-mode of operation in the lower and higher stop-bands. In this way, the SAW filter provides common-mode output signals at frequencies outside the pass-band. These common-mode output signals are not significantly amplified by the downstream differential LNA. Therefore, stringent non-linearity requirements (especially in terms of third order suppression) can be satisfied by a circuit that includes both a SAW filter with differential outputs and an LNA with differential inputs.

Example applications of circuits disclosed herein include GPS LNA's, as well as LNA's, for cellular applications such as, wireless local area network (WLAN), Universal Mobile Telecommunications System (UMTS), long-term evolution (LTE), 4G, and 3G.

Any components that are described herein as being "coupled" or "connected" could be directly or indirectly coupled or connected. That is, one or more components could be located between two components that are said to be coupled or connected whilst still enabling the required functionality to be achieved.

The invention claimed is:

1. An amplification circuit comprising:
   a first surface acoustic wave (SAW) filter comprising:
   an input for receiving an input signal;
   a first differential output; and
   a second differential output;
   wherein the first filter has a differential mode of operation for frequencies in its pass-band and a common mode of operation for frequencies outside its pass-band; and further having:
   a first magnitude transfer function from the input of the first filter to the first differential output of the first filter;
   a second magnitude transfer function from the input of the first filter to the second differential output of the first filter;
   a first phase transfer function from the input of the first filter to the first differential output of the first filter; and
   a second phase transfer function from the input of the first filter to the second differential output of the first filter; and wherein
   the difference between the first magnitude transfer function and the second magnitude transfer function for frequencies outside the pass-band of the first filter is less than a first threshold value of 3 dB;
   the difference between the first phase transfer function and the second phase transfer function for frequencies outside the pass-band of the first filter is less than a second threshold value of 40°;
   the difference between the first phase transfer function and the second phase transfer function for frequencies inside the pass-band of the first filter is less than a third threshold value of 20° away from 180°
   an LNA comprising:
   a first differential input connected to the first differential output of the first filter;
   a second differential input connected to the second differential output of the first filter; and
   an output for providing an amplified output signal.

2. The amplification circuit of claim 1, wherein the first threshold is less than 2 dB, the second threshold is less than 30°, and the third threshold is less than 10°.

3. The amplification circuit of claim 1, wherein the first threshold is less than 1 dB, the second threshold is less than 20°, and the third threshold is less than 5°.

4. The amplification circuit of claim 1, wherein the pass-band of the first filter includes frequencies at 1600 MHz and difference between the first phase transfer function and the second phase transfer function remains less 40° for frequencies up to 6 GHz.

5. The amplification circuit of claim 1, further comprising a matching circuit connected in series between the first and second differential inputs of the LNA and the first and second differential outputs of the first filter.

6. The amplification circuit of claim 5, wherein the matching circuit comprises a low-pass matching circuit.

7. The amplification circuit of claim 5, wherein the matching circuit comprises a high-pass matching circuit.

8. The amplification circuit of claim 7, wherein the high-pass matching circuit comprises:
   a first capacitor in series between the first differential input of the LNA and the first differential output of the first filter;
   a second capacitor in series between the second differential input of the LNA and the second differential output of the first filter; and
   an inductor connected between the first differential input of the LNA and the second differential input of the LNA or a notch filter connected between the first differential input of the LNA and the second differential input of the LNA.

9. The amplification circuit of claim 8, wherein the first capacitor and second capacitor comprise integrated capacitors.

10. The amplification circuit of claim 9, wherein the first capacitor, second capacitor and first filter are provided in a single integrated circuit.

11. The amplification circuit of claim 1, wherein the input to the first filter comprises a single-ended input.

12. The amplification circuit of claim 1, wherein the output of the LNA comprises a single-ended output.

13. The amplification circuit of claim 12, further comprising a second filter comprising:
    a single-ended input connected to the single-ended output of the LNA; and
    an output for providing a filtered amplified output signal.

14. The amplification circuit of claim 1, wherein the output of the LNA comprises a first LNA differential output and a second LNA differential output.

15. The amplification circuit of claim 14, further comprising a second filter comprising:
    a third differential input connected to the first LNA differential output of the LNA;
    a fourth differential input connected to the second LNA differential output of the LNA; and
    an output for providing a filtered amplified output signal;
    wherein the second filter has a differential mode of operation for frequencies in its pass-band and a common mode of operation for frequencies outside its pass-band.

16. A GPS receiver circuit comprising:
    an antenna;
    the amplification circuit of claim 1.

* * * * *